(12) United States Patent
Kaiju et al.

(10) Patent No.: US 6,975,110 B2
(45) Date of Patent: Dec. 13, 2005

(54) MAGNETIC SENSOR UTILIZING MAGNETORESISTANCE EFFECT, METHOD FOR DRIVING MAGNETIC SENSOR UTILIZING MAGNETORESISTANCE EFFECT AND MAGNETIC RECORDING SYSTEMS

(75) Inventors: Hideo Kaiju, Yokohama (JP); Kazuo Shiiki, Yokohama (JP)

(73) Assignee: Keio University, Tokyo (JP)

( * ) Notice: Subject to any disclaimer, the term of this patent is extended or adjusted under 35 U.S.C. 154(b) by 35 days.

(21) Appl. No.: 10/827,367

(22) Filed: Apr. 20, 2004

(65) Prior Publication Data

US 2004/0257186 A1  Dec. 23, 2004

(30) Foreign Application Priority Data

Apr. 23, 2003  (JP) .............................. 2003-118197

(51) Int. Cl.[7] .......................... G01R 33/09; G11B 5/39
(52) U.S. Cl. ........................ 324/252; 360/62; 360/313
(58) Field of Search ............................. 324/244, 252, 324/260; 360/61–62, 313, 317–318, 324, 360/324.2, 325–327

(56) References Cited

FOREIGN PATENT DOCUMENTS

| JP | 6-338005   | 12/1994 |
| JP | 9-80134    | 3/1997  |
| JP | 2002-237628 | 8/2002  |

Primary Examiner—Bot LeDynh
(74) Attorney, Agent, or Firm—Armstrong, Kratz, Quintos, Hanson & Brooks, LLP.

(57) ABSTRACT

The invention relates to a magnetic sensor utilizing a magnetoresistance effect, a method for driving a magnetic sensor utilizing a magnetoresistance effect and a magnetic recording system, and an object of the invention is to overcome the restriction in the level of sensitivity due to the upper limit of the sensing current that can be made to flow. A magneto resistive element 4 is connected to a portion of a feedback loop of a transistor 2 and an LC circuit 3 in an oscillating circuit 1 formed of transistor 2 and LC circuit 3, which is provided with a switching means 5 so that the reading rate of magnetic data is regulated by the switching frequency of switching means 5.

5 Claims, 4 Drawing Sheets

Diagram Showing Configuration of Principle of Present Invention

1: oscillating circuit
2: transistor
3: LC circuit
4: magneto resistive element
5: switching means Diagram Showing Configuration of Principle of Present Invention 1: oscillating circuit
2: transistor
3: LC circuit
4: magneto resistive element
5: switching means Circuit Configuration Diagram Showing Highly Sensitive Magnetic Detection Circuit According to First Embodiment of Present Invention Graphs Showing Results of Oscillation Output According to First Embodiment of Present Invention (a)

(b)

(c)

Circuit Configuration Diagram Showing Highly Sensitive Magnetic Detection Circuit According to Second Embodiment of Present

MAGNETIC SENSOR UTILIZING MAGNETORESISTANCE EFFECT, METHOD FOR DRIVING MAGNETIC SENSOR UTILIZING MAGNETORESISTANCE EFFECT AND MAGNETIC RECORDING SYSTEMS

TECHNICAL FIELD

The present invention relates to a magnetic sensor utilizing a magnetoresistance effect, a method for driving a magnetic sensor utilizing a magnetoresistance effect and a magnetic recording system, and in particular, to a magnetic sensor utilizing a magnetoresistance effect, a method for driving a magnetic sensor utilizing a magnetoresistance effect and a magnetic recording system which are characterized by a circuit configuration for detecting magnetic data with a level of sensitivity higher than in the prior art.

BACKGROUND ART

In recent years, magnetic heads utilizing a giant magneto resistive (GMR) effect have been used as magnetic heads for reproduction in high density magnetic recording systems.

According to a method for sensing magnetism in such a magnetic head, a constant sensing current is made to flow through a GMR element where a non-magnetic conductive layer is placed between a magnetic layer (pinned layer) of which the direction of magnetization is fixed, and a magnetic layer (free layer) of which the direction of magnetization is free so that a phenomenon is utilized, wherein the potential difference of the GMR element changes in response to a change in the magnetic flux that leaks from the magnetic recording medium in which a magnetic recording signal has been written at a high density.

Accordingly, though a large output can be gained in accordance with the Ohm's law in the case where a large amount of current is made to flow, there is a limit in the amount of sensing current that can actually flow, due to the emission of heat and the like.

In recent years, research has been progressing on magnetic heads utilizing a spin tunneling magneto resistive (TMR) effect, which are magnetic heads for reproduction, and will substitute for such GMR elements of the next generation (see, for example, Japanese Unexamined Patent Publication 2002-237628).

Such a TMR element has a structure where an insulating layer, such as Al-oxide, is sandwiched between a magnetic layer (pinned layer) of which the direction of magnetization is fixed, and a magnetic layer (free layer) of which the direction of magnetization is free, and in the case where a sensing current is made to flow perpendicular to the surface of a magnetic sensing film, the tunnel current that passes through the insulating film changes in accordance with the angle made between the directions of magnetization of the two magnetic layers, so that this change can be read out as a change in the potential difference of the TMR element.

A large output can be expected from such a TMR element because an extremely large resistance changing ratio such as, for example, several tens of % can be gained.

However, an insulating film, such as Al-oxide, is inserted in a TMR element, and therefore, the resistance value is too large to allow a large sensing current to actually flow, and accordingly, a problem arises that a large output cannot be gained.

In addition, there is a defect in that there is a large amount of noise due to the large resistance, and therefore, in the case where the output of the TMR element is amplified, noise is also greatly amplified, preventing the detection of a microscopic magnetic flux from being carried out with a high level of precision.

On the other hand, the usage of an MR element having a low level of detection sensitivity has been proposed wherein the MR element is incorporated in a Hartley-type oscillating circuit, or a Colpitts-type oscillating circuit, so as to convert the change in the resistance of the MR element into a change in the reactance, and thereby, the existence of a high frequency signal is detected (see, for example, Japanese Unexamined Patent Publication H6(1994)-338005).

In the case of the above described Japanese Unexamined Patent Publication H6(1994)-338005, however, an MR element forms a part of an LC circuit: that is to say that the MR element forms a resonance part of an oscillating circuit, and therefore, a problem arises that the oscillation becomes unstable when the resistance of the MR element changes.

Therefore, though no actual problems arise in the case where an error of approximately $10^{-4}$ to $10^{-5}$ is allowed, such as in a video cassette recorder for recording image data, a problem arises that an MR element is not suitable for a sensing method that requires an error rate of approximately $10^{-7}$ or less, such as in a hard disk drive.

In addition, an MR element forms a resonance circuit, and therefore, there is a risk that a large amount of current flows through the MR element, and thereby, the element characteristics are changed or damaged.

In particular, in the case of a TMR element that has an insulating layer, and where an insulation breakdown becomes a problem, the above described circuit configuration is not practical.

Accordingly, an object of the present invention is to overcome the restriction in the level of sensitivity due to the upper limit of the sensing current that can be made to flow.

DISCLOSURE OF THE INVENTION

FIG. 1 is a diagram showing the configuration of the principle of the present invention, and a means for solving the problems according to the present invention is described in reference to this FIG. 1.

See FIG. 1.

(1) A magnetic sensor utilizing a magnetoresistance effect according to the present invention, is characterized in that a magneto resistive element 4 is connected to a portion of a feedback loop of a transistor 2 and an LC circuit 3 in an oscillating circuit 1 which is formed of transistor 2 and LC circuit 3, and which is provided with a switching means 5 so that the reading rate of magnetic data is regulated by the switching frequency of switching means 5.

In this manner, magneto resistive element 4 is connected to a portion of the feedback loop of transistor 2 and LC circuit 3 which form oscillating circuit 1, and thereby, it becomes possible to detect a magnetic signal with an output several tens of times higher than in the prior art.

In addition, oscillation that has once started can be controlled and stopped by providing switching means 5 and the reading rate of magnetic data can be regulated by the switching frequency of this switching means 5.

(2) In addition, the above described (1) according to the present invention is characterized in that oscillating circuit 1 is either a Hartley-type oscillating circuit, or a Colpitts-type oscillating circuit.

In this manner, a Hartley-type oscillating circuit, or a Colpitts-type oscillating circuit, which are well known oscillating circuits, is used, and thereby, a stable oscillation operation can be gained in a simple circuit configuration.

That is to say, a Hartley-type oscillating circuit, or a Colpitts-type oscillating circuit, which allow a high frequency oscillation, is suitable for the detection of a magnetic signal in a high frequency band of 1 MHz, or higher.

(3) In addition, the above described (1) or (2) according to the present invention is characterized in that magneto resistive element 4 is a tunnel magneto resistive element.

Either a tunnel magneto resistive element (TMR element) or a spin valve-type giant magneto resistive element (GMR element), which allow a relatively large magnetoresistance effect to be gained, is suitable for magneto resistive element 4 for detecting magnetic signals.

In particular, when a high frequency magnetic signal is detected, a particularly remarkable effect is gained in the case where a capacitive element, such as a tunnel magneto resistive element (TMR element) is used as magneto resistive element 4.

(4) In addition, a method for driving a magnetic sensor according to the present invention, is characterized in that a magneto resistive element 4 is connected to a portion of a feedback loop of a transistor 2 and an LC circuit 3 in an oscillating circuit 1 which is formed of transistor 2 and LC circuit 3, and which is provided with a switching means 5 so that the reading rate of magnetic data is regulated by the switching frequency of switching means 5.

In this manner, the reading rate of magnetic data is regulated by the switching frequency of switching means 5 for controlling and stopping the oscillation, and therefore, a high rate of reading becomes possible by making the switching frequency of switching means 5 higher.

Here, it is necessary to change the oscillation frequency of oscillating circuit 1 in accordance with the switching frequency, and it is desirable to make the oscillation frequency ten or more times higher than the switching frequency.

(5) In addition, a magnetic recording system according to the present invention is characterized by being provided with the magnetic sensor utilizing a magnetoresistance effect according to any of the above described (1) to (3), which is used as a magnetic head for reproduction.

In this manner, a magnetic sensor, utilizing a magnetoresistance effect according to any of the above described (1) to (3), is provided as a magnetic head for reproduction, and thereby, it becomes possible to implement a high density magnetic recording system that can be miniaturized so that the leakage magnetic field becomes microscopic.

In addition, the S/N ratio can be increased due to an increase in the level of the sensitivity in comparison with the case where an amplifier is simply used, and accordingly, it is less affected by a dispersion in the characteristics of magneto resistive element 4, and thus, it becomes possible to increase the manufacturing yield of TMR elements having a poor reproducibility of the element characteristics.

BEST MODE FOR CARRYING OUT THE INVENTION

Here, in reference to FIGS. 2 and 3(a) to 3(c), a method for detecting magnetism with a high level of sensitivity according to the first embodiment of the present invention, is described below.

Figure 1:
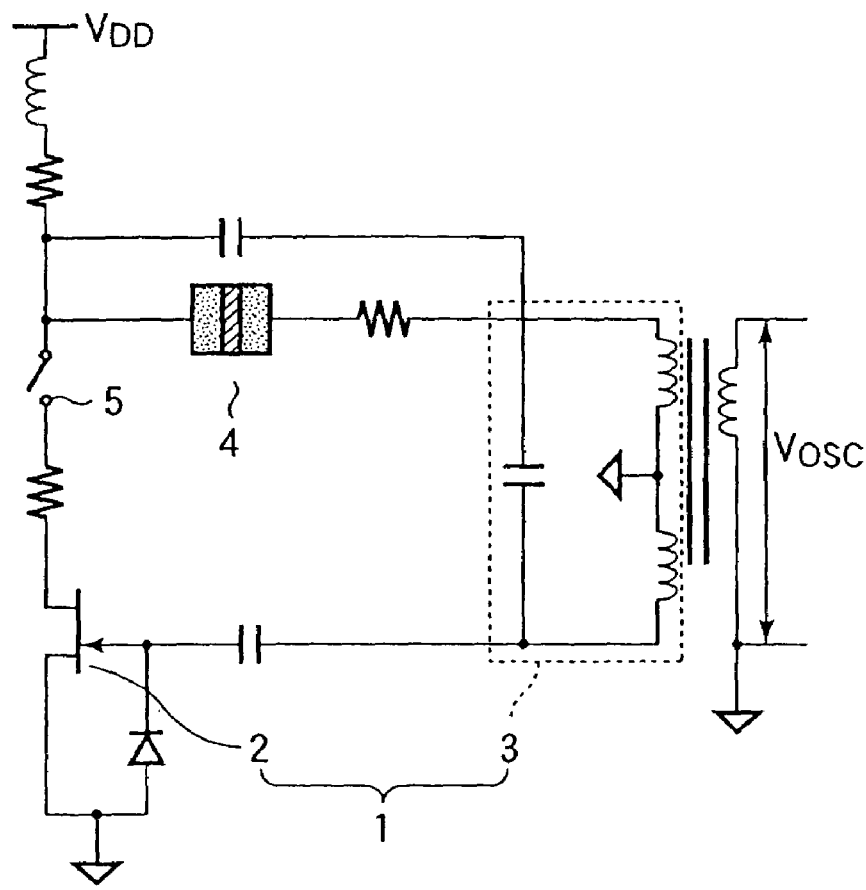
FIG. 1 is a diagram showing the configuration of the principle of the present invention.
Figure 2:
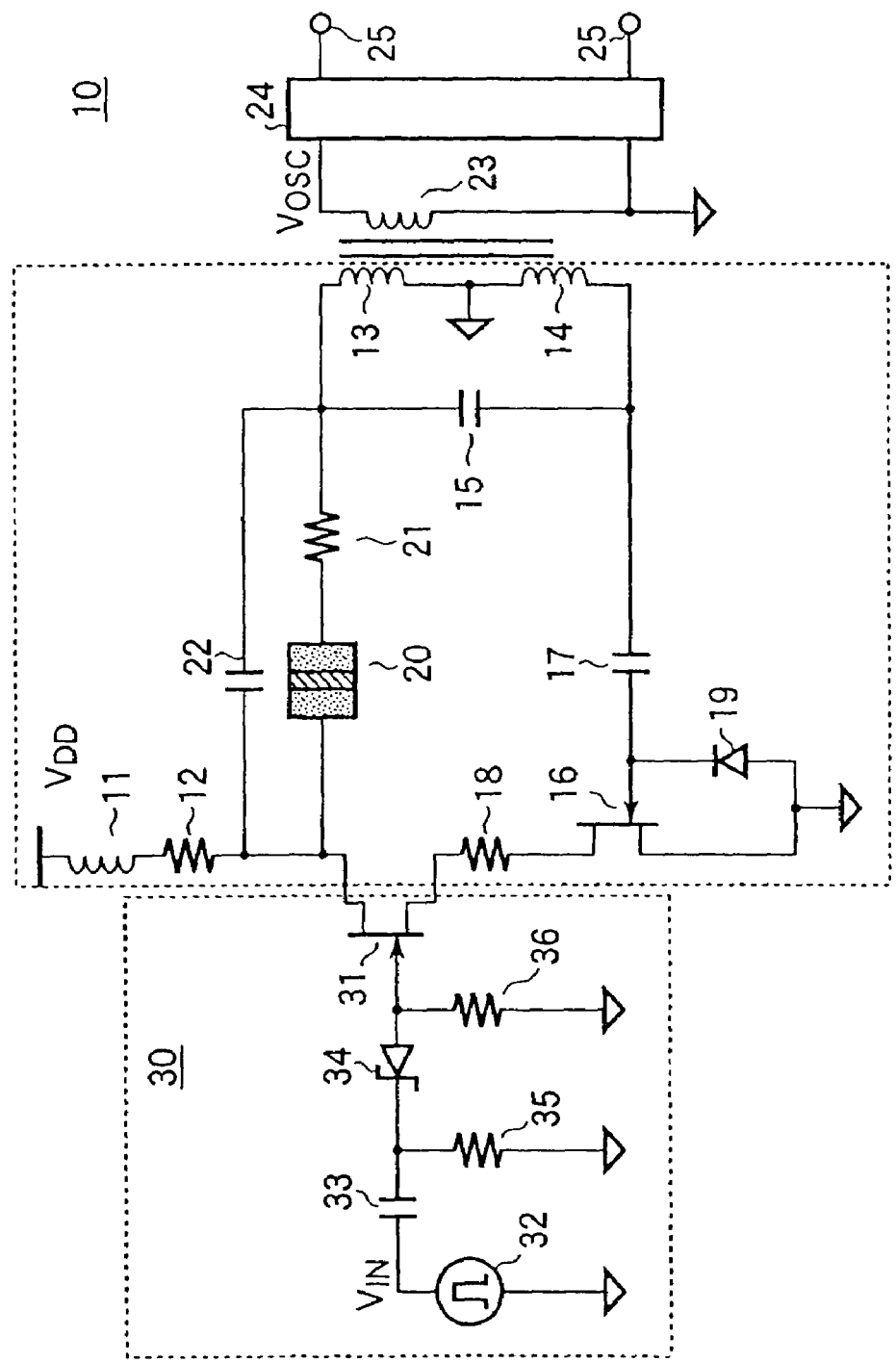
FIG. 2 is a circuit configuration diagram showing a highly sensitive magnetic detection circuit according to the first embodiment of the present invention.

See FIG. 2.

FIG. 2 is a circuit configuration diagram showing a highly sensitive magnetic detector according to the first embodiment of the present invention which is formed of a Hartley-type oscillating circuit 10 and an RF switching circuit 30.

Hartley-type oscillating circuit 10 is formed of an LC resonance circuit where inductors 13 and 14 are connected in series parallel to a capacitor 15. This LC resonance circuit, a TMR element 20, RF switching circuit 30, a resistor 18 and the drain of a transistor 16, are connected in series.

In this case, a resistor 21 is connected to TMR element 20 in series, which is connected parallel to a capacitor 22, so that one end of TMR element 20 is connected to a power supply $V_{DD}$ via a resistor 12 and an inductor 11, in order to reduce the amount of direct current and alternating current that flow through TMR element 20, and in order to prevent the element from being damaged or the characteristics of the element from being changed.

Though TMR element 20 in this case may be of any type, here, the TMR element is made of an FeCo pinned layer/ Al-oxide/NiFe free layer, wherein, the difference in the coercive force between FeCo and NiFe is utilized so as to fix the direction of magnetization of the FeCo pinned layer in the direction of application of the initial external magnetic field.

In addition, the other end of the LC resonance circuit is connected to the gate of transistor 16 via a capacitor 17 and is grounded via a diode 19.

Furthermore, RF switching circuit 30 is provided with a high frequency transistor 31, and a pulse input $V_{IN}$ from a pulse generator 32 is inputted to the gate of high frequency transistor 31, via a differentiating circuit formed of a capacitor 33 and a resistor 35, as well as a half-wave rectifier circuit formed of a diode 34 and a resistor 36, so as to control the switching operation of high frequency transistor 31.

In the case where the impedance of TMR element 20 changes under the effect of an external magnetic field so as to satisfy the oscillation condition of Hartley-type oscillating circuit 10 in the state where the above described RF switching circuit 30 has been turned on, oscillation is started by the LC resonance circuit formed of inductors 13 and 14 and capacitor 15, wherein inductors 13 and 14 are connected in series parallel to capacitor 15, so that an oscillation signal $V_{osc}$ is inputted into a direct current conversion circuit 24 formed of a wave detector and a low-pass filter via an inductor 23 that forms a transformer, and is then outputted from a terminal 25.

However, once the oscillation has started due to a change in the impedance of TMR element 20, the oscillation does not stop even when the impedance of TMR element 20 returns to its original value, and therefore, RF switching circuit 30 has to be turned off in order to stop the oscillation.

In order to turn off RF switching circuit 30, the falling portion of pulse input $V_{IN}$, which is applied to RF switching circuit 30, is utilized so as to make a window of ON/OFF that switches in accordance with the frequency of pulse input $V_{IN}$.

A change in the impedance of TMR element 20, that occurs within a window of which the ON time is approximately 3.9 ns, is detected by a pulse input $V_{IN}$ of, for example, 250 MHz, and the oscillation is reset during an OFF time of approximately 0.1 ns.

As a result of setting the inductances of both inductors 13 and 14 at 0.1 nH and the capacitance of capacitor 15 at 0.1 pF in this Hartley-type oscillating circuit 10, oscillation occurs at an oscillation frequency of 17.2 GHz.

In addition, it is necessary to reduce the period of time for oscillation start-up in a high rate magnetic detection, and therefore, a high frequency InGaAs FET or the like, having a large amplification factor which is operable at room temperature, is used as transistor 16 so that an extremely short period of time for oscillation operation start-up of approximately 0.1 ns can be implemented.

Furthermore, only small amounts of the direct and alternating currents are allowed to flow through the above described TMR element 20. Thus, the resistance value of resistor 21, which is connected to TMR element 20, is set at 1.3 kΩ, for example, while the capacitance of capacitor 22 is set at 50 pF so that the current that flows through TMR element 20 can be limited to approximately 1.7 mA.

Here, this resistance value and the capacitance hardly affect the oscillation condition.

In addition, by setting power supply $V_{DD}$, inductance 11 and resistor 12 at 15 V, 1 mH and 100 Ω respectively, an output of $V_{OSC}=5$ $V_{pp}$ or greater can be gained as the peak-to-peak oscillation voltage.

Here, the capacitance of capacitor 17 is 1 pF, and the resistance value of resistor 18 is 4 Ω.

Figure 3:
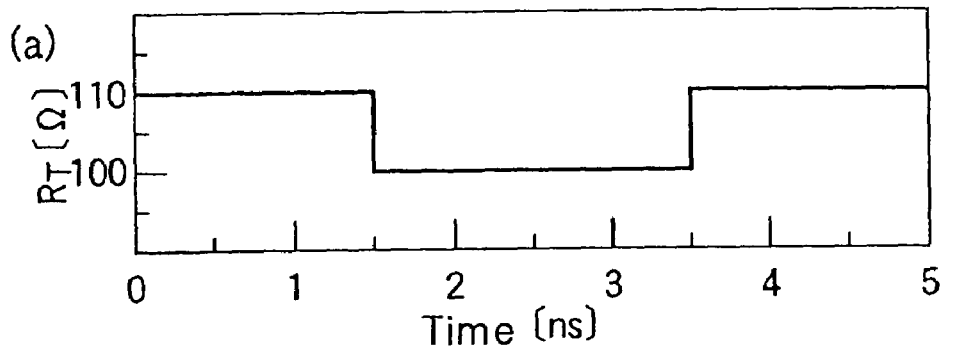
FIGS. 3(a), 3(b) and 3(c) are graphs showing the results of oscillation output according to the first embodiment of the present invention.
Figure 3:
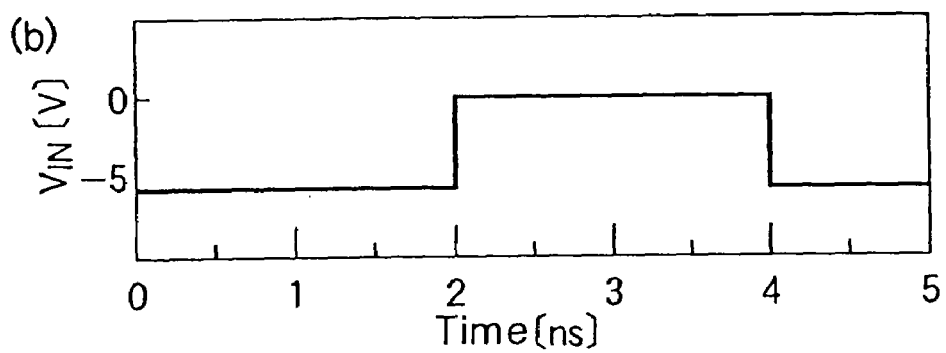
Figure 3:
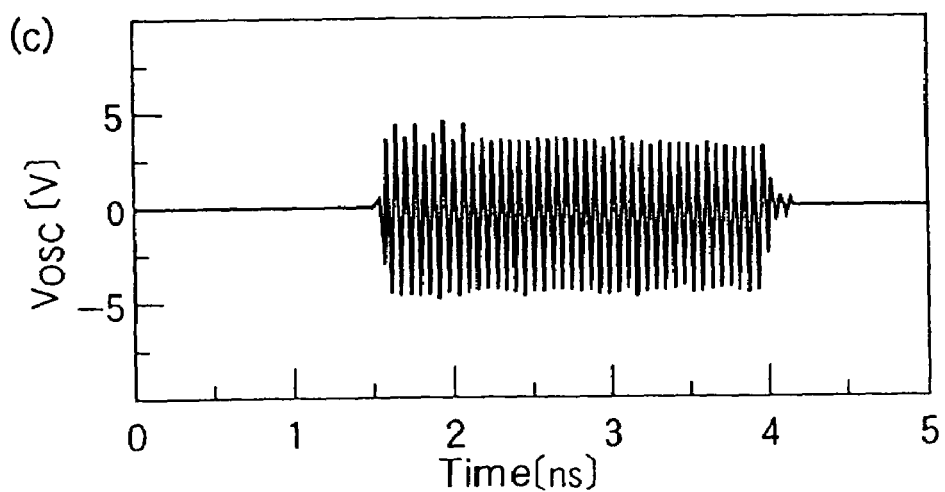

Next, the results of detection of the oscillation output are described in reference to FIGS. 3(a) to 3(c).

See FIGS. 3(a) to 3(c).

FIG. 3(a) is a time chart showing a change in the resistance value $R_T$ of TMR element 20 and exhibits that resistance value $R_T$ has changed from 110 Ω to 100 Ω due to an external magnetic field at t=1.5 ns.

In addition, FIG. 3(b) shows a voltage wave form of pulse input $V_{IN}$ from pulse generator 32, which indicates a pulse voltage of 250 MHz, and the switching circuit is turned off when the voltage of this pulse falls.

Furthermore, FIG. 3(c) shows a wave form diagram of oscillation detection output $V_{OSC}$ which is in a standby condition where RF switching circuit 30 is turned on at t=0 ns and detects a change in resistance value $R_T$ of TMR element 20 at t=1.5 ns, as shown in FIG. 3(a), allowing oscillation to start with an oscillation operation start-up time of approximately 0.1 ns in accordance with the characteristics of transistor 16.

Subsequently, after the ON time of 3.9 ns has passed starting from t=0, RF switching circuit 30 turns off at t=4.0 ns, and the oscillation stops for an oscillation stop delay time of 0.15 ns, in the case where the oscillation has been reset during an OFF time of approximately 0.1 ns as pulse input $V_{IN}$ falls.

Oscillation voltage $V_{OSC}$ in this case becomes a peak-to-peak voltage of 8.3 $V_{pp}$ indicating that an output several tens of times higher than the detection output of a conventional TMR element is gained.

In other words, according to the first embodiment of the present invention, where a change in the impedance is caused by an application of an external magnetic field, TMR element 20 is incorporated within the feedback loop of Hartley-type oscillating circuit 10 and the oscillation frequency is primarily determined by inductors 13 and 14 as well as capacitor 15 so as to become stable, and therefore, an error rate of $10^{-7}$ or less can be easily realized.

However, the oscillation does not stop even when the element resistor returns to its original value, because of the stability of the oscillation, and therefore, it becomes possible to detect, with a high sensitivity, the existence of a signal indicating whether or not a change in the magnetic field occurs during a certain period of time, by combining the element resistor with RF switching circuit 30 which controls the oscillation.

In addition, the amount of current that flows through TMR element 20 can be reduced by inserting a resistor 21 and a resistor 22 into TMR element 20 of the feedback loop in such a manner that resistor 21 is in series with TMR element 20, and resistor 22 is parallel to TMR element 20, and in effect, breakdown of TMR element 20 can be prevented.

In this manner, in the case of a highly sensitive magnetic detector according to the first embodiment of the present invention, a very large output with a high sensitivity can be gained in comparison with the prior art, and signals of "0" and "1" can be stably detected even when the element characteristics of the TMR element are dispersed. As a result, the efficiency percentage of the TMR element can be enhanced leading to an increase in the manufacturing yield.

That is to say, it is difficult to form a uniform tunnel insulating film with a high reproducibility in a TMR element at the time when the tunnel insulating film is formed of Al-oxide by oxidizing Al, and therefore, the element characteristics are greatly dispersed. However, the present invention makes it possible to utilize elements conventionally considered to be defective, as good products.

Figure 4:
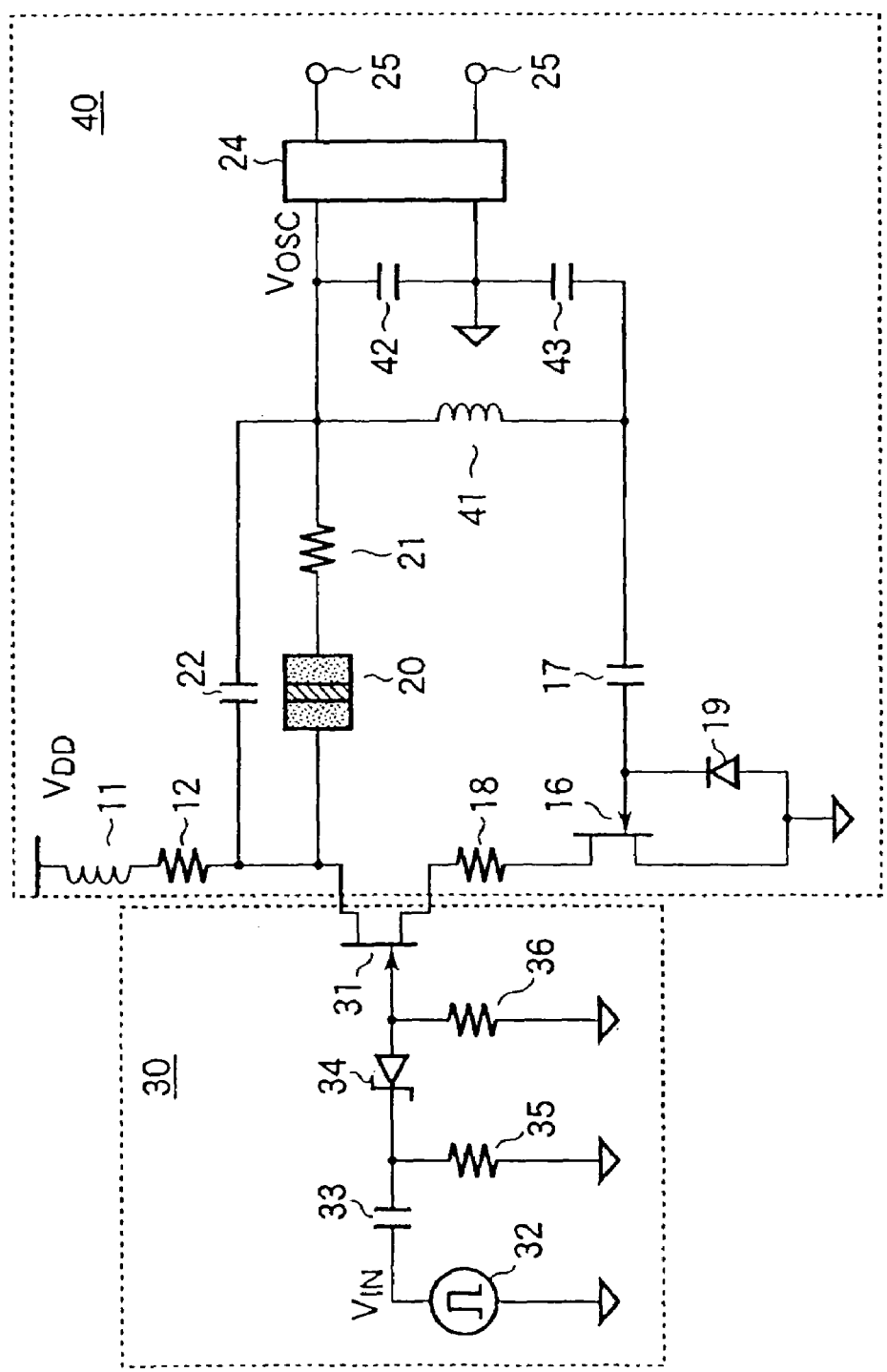
FIG. 4 is a circuit configuration diagram showing a highly sensitive magnetic detection circuit according to the second embodiment of the present invention.

Next, a highly sensitive magnetic detection circuit according to the second embodiment of the present invention is described in reference to FIG. 4, wherein the Hartley-type oscillating circuit in the above described highly sensitive magnetic detection circuit according to the first embodiment is replaced with a Colpitts-type oscillating circuit. Since the basic configuration remains the same, the detailed descriptions are omitted.

See FIG. 4.

FIG. 4 is a circuit configuration diagram of a highly sensitive magnetic detector according to the second embodiment of the present invention, wherein a Colpitts-type oscillating circuit 40 is formed by replacing the LC resonance circuit, which is formed of inductors 13 and 14 and capacitor 15 so that inductors 13 and 14 are connected in series parallel to capacitor 15 in Hartley-type oscillating circuit 10, with an LC resonance circuit formed of capacitors 42 and 43 and an inductor 41, wherein capacitors 42 and 43 are connected in series parallel to inductor 41.

In this case, an oscillation signal $V_{OSC}$ is inputted to a direct current conversion circuit 24 formed of a wave detector and a low-pass filter via a capacitor 42 that forms the LC resonance circuit and is outputted from a terminal 25.

In this second embodiment, a Colpitts-type oscillating circuit is used as the oscillating circuit, and therefore, the formation of an inductor is easy in comparison with the Hartley-type oscillating circuit, providing a circuit configuration suitable for an LSI or the like.

Here, a magnetic detection method for detecting a change in the oscillation frequency by forming a part of the oscillating circuit of an element of which the impedance varies has been proposed (see Japanese Unexamined Patent Publication H9(1997)-080134, for example). However, this detects a change in the oscillation frequency and has a completely different principle from the present invention where the existence of the oscillation is detected.

Though the embodiments of the present invention are described above, the present invention is not limited to the configurations and conditions described in the embodiments, but rather a variety of modifications are possible.

For example, though the above described embodiments are set forth on the premise that a magnetic sensor is used for a reproduction head, the present invention is not limited to a magnetic sensor for a reproduction head, but rather can be applied to a variety of magnetic sensors that are utilized for sensing a doze while driving, a touch sensor, a water level sensor, garbage disposal segregation sensor, crime prevention sensor, and the like.

In addition, though in the above described embodiments a TMR element having an FeCo/Al-oxide/NiFe structure is used as the magneto-resistive element, any materials may be combined to form a free layer and a pinned layer wherein the difference in the coercive force may be utilized.

Furthermore, the pinned layer may be pinned by using an antiferromagnetic layer, such as IrMn or PdPtMn without utilizing the difference in the coercive force, and thereby, the pinning of the pinned layer is stabilized, and it becomes possible to form the pinned layer and free layer of the same material.

In addition, the numeral values of the respective components in the circuit shown in FIG. 2 are of course merely examples, and the oscillation frequency of the LC oscillating circuit and the frequency of pulse input $V_{IN}$ may be appropriately set in accordance with the recording density in the magnetic disc.

Transistors, resistors, capacitors, and the like may not be discrete parts but may be used by integrating them on a substrate such as an IC or an LSI.

In addition, though a TMR element having a particularly great effect as the magneto resistive element is used, the present invention is not limited to the TMR element, but rather a GMR element or an MR element may also be used as long as the impedance thereof varies due to an external magnetic field. In particular, taking noise into consideration, it is desirable to use a capacitive element wherein not only the real part of the impedance but also the imaginary part vary, as in the TMR element.

According to the present invention, a magneto resistive element, of which the impedance varies due to an external magnetic field, is incorporated within a feedback loop formed of the magneto resistive element and an oscillating circuit, and therefore, an output several tens of times more stable than in the prior art can be gained, greatly contributing to the implementation of a highly sensitive magnetic head for reproduction of the next generation.

What is claimed is:

1. A magnetic sensor utilizing a magnetoresistance effect, characterized in that a magneto resistive element is connected to a portion of a feedback loop of a transistor and an LC circuit in an oscillating circuit which is formed of said transistor and said LC circuit, and which is provided with a switching means so that the reading rate of magnetic data is regulated by the switching frequency of said switching means.

2. The magnetic sensor utilizing a magnetoresistance effect according to claim 1, characterized in that said oscillating circuit is either a Hartley-type oscillating circuit, or a Colpitts-type oscillating circuit.

3. The magnetic sensor utilizing a magnetoresistance effect according to claim 1, characterized in that said magneto resistive element is a tunnel magneto resistive element.

4. A method for driving a magnetic sensor utilizing a magnetoresistance effect, characterized in that a magneto resistive element is connected to a portion of a feedback loop of a transistor and an LC circuit in an oscillating circuit which is formed of said transistor and said LC circuit, and which is provided with a switching means so that the reading rate of magnetic data is regulated by the switching frequency of said switching means.

5. A magnetic recording system, characterized by comprising the magnetic sensor utilizing a magnetoresistance effect according to claim 1, which is used as a magnetic head for reproduction.

* * * * *